United States Patent [19]

Mao

[11] Patent Number: 5,153,467
[45] Date of Patent: Oct. 6, 1992

[54] BOOTSTRAP CIRCUIT FOR WORD LINE DRIVER IN SEMICONDUCTOR MEMORY

[75] Inventor: Robert S. Mao, Hsinchu, Taiwan

[73] Assignee: Etron Technology, Inc., Hsinchu, Taiwan

[21] Appl. No.: 713,507

[22] Filed: Jun. 12, 1991

[51] Int. Cl.⁵ ............................................ H03K 17/04
[52] U.S. Cl. .................................. 307/482; 307/451; 307/246; 365/189.09
[58] Field of Search ............... 307/451, 475, 481–482, 307/246, 264, 296.2; 365/189.09, 204, 230.06; 323/311

[56] References Cited

U.S. PATENT DOCUMENTS

| | | | |
|---|---|---|---|
| 4,471,240 | 9/1984 | Novosel | 307/482 X |
| 4,484,092 | 11/1984 | Campbell, Jr. | 307/482 X |
| 4,494,018 | 1/1985 | Clemen et al. | 307/482 |
| 4,697,111 | 9/1987 | Van Zantan et al. | 307/482 |
| 4,922,128 | 5/1990 | Dhong et al. | 307/481 X |
| 4,922,138 | 5/1990 | Hashimoto et al. | 307/481 X |
| 4,954,731 | 9/1990 | Dhong et al. | 365/204 X |
| 5,038,325 | 8/1991 | Douglas et al. | 365/189.09 |

Primary Examiner—David Hudspeth
Attorney, Agent, or Firm—George O. Saile

[57] ABSTRACT

In a driver circuit for word lines of a semiconductor memory, a CMOS inverter stage and a first FET are connected to opposite terminals of a capacitor to alternately connect the capacitor across the terminals of the power supply for charging the capacitor and between the power supply and the load to add the voltages of the power supply and the capacitor. Second and third FETs form a latch that has one output connected to control the inverter stage and the other output connected to control the first FET. Fourth and fifth FETs are connected to receive a timing signal and to produce true and complement phases for controlling the latch.

10 Claims, 1 Drawing Sheet

BOOTSTRAP CIRCUIT FOR WORD LINE DRIVER IN SEMICONDUCTOR MEMORY

This invention relates generally to a CMOS circuit for switching a capacitor to double the voltage that is otherwise obtainable from an associated power supply. The circuit is particularly intended for use in the accessing circuits of a memory for a data processor.

INTRODUCTION

Voltage doubler circuits use a capacitor to provide a voltage that is approximately twice the voltage of the power supply. It will simplify this introduction to use the specific power supply polarity that is used in the preferred embodiment: one terminal is ground terminal and the other terminal is positive. (The general case will be evident from the discussion of this specific example.)

These circuits have switching devices that are operable in a cycle in which the capacitor is first charged from the power supply and then discharged into a load. In the charging phase of the cycle, the capacitor is connected across the power supply terminals so that one capacitor terminal is charged positive with respect to ground. In the discharging phase, the positively charged terminal is isolated from the power supply and is connected to the load that is to receive the doubled voltage. The negatively charged terminal is isolated from ground and reconnected to the positive power supply terminal. The voltage is doubled because the voltage across the capacitor has a polarity to add to the voltage of the positive terminal of the power supply.

A voltage doubler that is used in a memory accessing circuit is called a "bootstrap" circuit. In some memories, the elemental cell for storing one bit is formed by a capacitor and an FET. A large number of storage cells are arranged at the intersections of a matrix of bit lines and word lines. One terminal of the capacitor is connected to ground and the FET connects the other terminal to a bit line. The gate of the FET is connected to a word line. A charge on the capacitor represents a 1 bit and the absence of a charge represents a 0 bit. When a voltage is applied to a selected word line, it enables only these FETs turn on. In a read operation, the charge or absence of charge on the capacitor is sensed as a voltage on the bit line. In a write operation, selected bit lines are given a selected voltage level to charge or not charge the capacitor.

A bootstrap circuit is particularly useful for driving a word line because the gate voltage should be higher than the bit line voltage in order to prevent the FET from turning off when the capacitor charge has reached only a voltage. The bootstrap circuit is also advantageous for a word line driver circuit because the gate terminals connected to the word line present a capacitive load to the driver.

THE PRIOR ART

One bootstrap circuit of the prior art has a network of FETs connected to each terminal of a capacitor. A timing circuit operates these FETs to charge and discharge the capacitor in the general way that has been described already. One object of this invention is to provide an improved bootstrap circuit that operates in response to a simpler timing signal which appears at a single input to the new circuit.

U.S. Pat. No. 4,922,128 teaches a word line driver circuit in which two FETs have their gate and drain terminals cross connected by capacitors to improve switching speed. The new circuit of this invention uses two FETs that are cross connected to form a latch.

SUMMARY OF THE INVENTION

In the circuit of this invention, a bootstrap capacitor has one terminal connected to the output of a conventional CMOS inverter stage. During the charging phase, one FET in the inverter stage connects this terminal of the capacitor to ground and during the discharging phase the other inverter stage FET connects this terminal to the positive terminal of the power supply.

The doubled voltage appears at the other terminal of the capacitor, and this other terminal is connected directly to the circuit output. A circuit of five FETs connects this terminal to the positive power supply terminal during the charging phase. During the discharging phase these components are made completely isolated from this other capacitor terminal and from the circuit output.

The circuit for the switching the other terminal of the capacitor includes a first p-channel FET that is connected between the positive power supply terminal and the output node of the capacitor. This FET is turned on during the charging phase to form part of the charging circuit and it is turned off during the discharging phase.

A second and a third p-channel FETs have their drain and gate terminals cross connected to form a latch. One of the latch outputs controls the inverter stage and the other controls the first FET. A fourth and a fifth n-channel FETs are each connected to conduct between ground and the gate terminal of an associated FET of the latch (and the drain of the other FET of the latch). These two FETs are connected to conduct oppositely in response to an input signal that defines the charging and discharging phases and they trigger the latch to establish the capacitor cycle.

Advantageously, each FET conducts only while it is charging or discharging the bootstrap capacitor or the capacitance of a circuit node.

Another advantage of this circuit is that it has the minimum number of switching devices in the charging and discharging circuit of the bootstrap capacitor.

Other objects and advantages of the circuit will become apparent from the description of the preferred embodiment.

THE DRAWING

THE PREFERRED EMBODIMENT

Introduction

Figure 1:
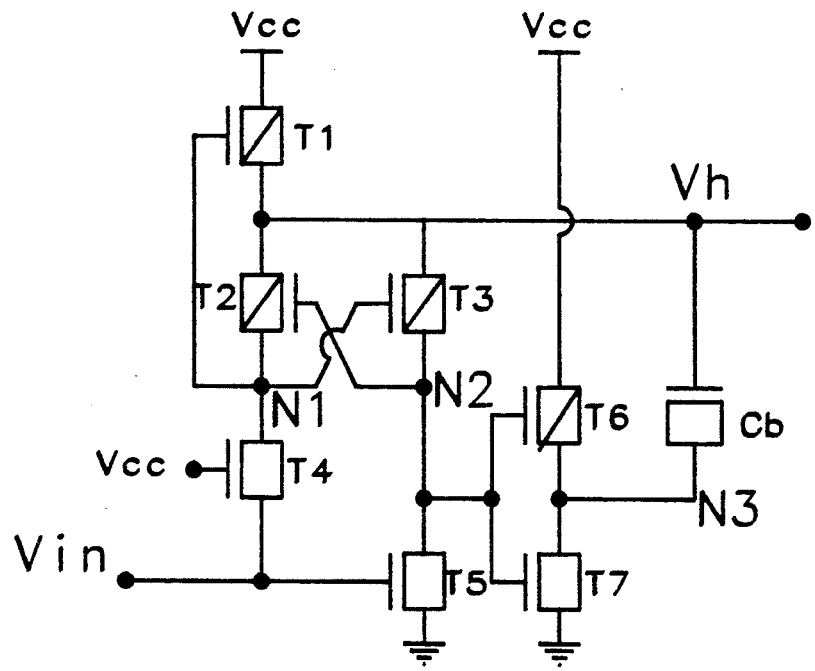
FIG. 1 is a schematic drawing of the preferred circuit of this invention

The circuit of FIG. 1 receives an input signal Vin on an input line and it produces an output at a node Vh. The input signal swings approximately between the power supply voltage Vcc and ground, and binary signals will be referred to as "up" and "down" for generality as to polarity and magnitude. When Vin is down, the circuit operates in its charging phase and the output Vh has the voltage of power supply terminal Vcc. When the input Vin is up, the circuit operates in its discharging phase and the output is given twice the voltage of Vcc.

The circuit has a capacitor Cb and FETs T1–T7; the interconnection of these components will be explained as the components appear in the description of the operation of the circuit. Note that the terminals of the capacitor are connected to circuit nodes Vh and N3; they will be referred to by these reference characters. In the general operation of the circuit, the capacitor is connected between ground and Vcc to be charged with Vh positive and N3 negative; then the connections are switched so that the negative node N3 is connected to Vcc and node Vh receives the sum of two voltages: Vcc from the power supply and the capacitor voltage, which equals Vcc.

The Output Inverter Stage

T6 and T7 are connected to form a conventional CMOS inverter stage. (In the drawing, a p-channel FET is shown as a block with a slash and an n-channel FET is shown as a block without a slash.) The operation of the inverter stage and the other circuit elements can be understood easily by considering that the positive up voltage of the preferred embodiment turns on an n-channel FET and turns off a p-channel FET and, conversely, a down voltage level turns on a p-channel FET and turns off an n-channel FET.

The input of the inverter stage is connected to a node N2 (explained later) and its output is connected to node N3. When node N2 is given an up level, T7 turns on and connects capacitor terminal N3 to ground. When Node N2 is down, T6 turns on and connects the associated terminal of the capacitor (N3 is now the negatively charged terminal of Cb) to Vcc. The circuits that form the connection for the other terminal of the capacitor will be described next.

The Other Capacitor Switching FET

A p-channel FET T1 has its drain and source terminals connected to conduct between Vcc and node Vh. The gate of T1 is connected to a node N1, and other components control the voltage at node N1 to turn T1 on during the charging phase (when Vin is down) and to turn T1 off during the discharging phase.

The Latch Circuit

P-channel FETs T2 and T3 have their drain and gate terminals cross connected at nodes N1, N2 to form a latch. Their source terminals are connected to a suitable point of potential, as will be explained later. Thus, one side of the latch controls T1, which switches one node of the capacitor, and the other side of the latch controls inverter T6, T7, which switches the other terminal of the capacitor.

The Latch Control Circuit

N-channel FETs T4 and T5 are connected to switch oppositely in response to the signal on the input line. T5 has its gate connected to Vin and its source connected to ground so that it turns on when Vin is up and turns off when Vin is down. T4 has its source terminal connected to Vin and its gate terminal connected to Vcc so that it turns on when T5 turns off and it turns off when T5 turns on. (The components that establish the down level on the input line conduct in series with the source terminal of T4.)

The drain terminal of T4 is connected to node N1 and the drain terminal of T5 is connected to node 2, and these FET's charge and discharge the capacitance of these nodes to switch the other FETS.

Figure 2:
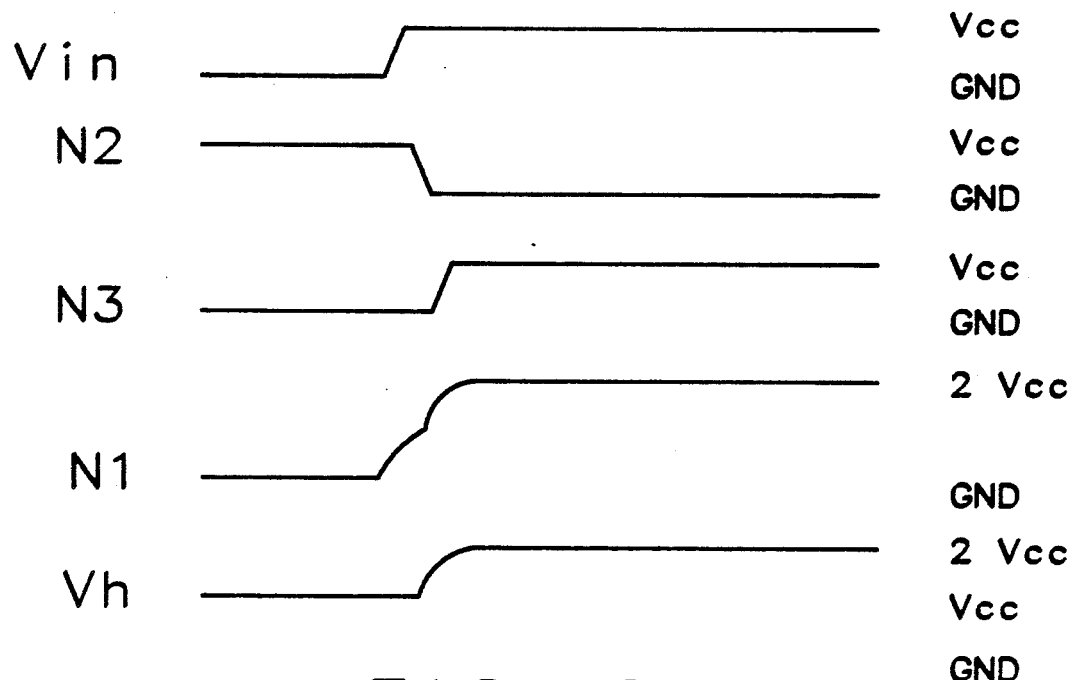
FIG. 2 shows waveforms at five nodes of the circuit during a cycle of charging and discharging the bootstrap capacitor. The nodes are identified by symbols in the left column of the drawing which identify nodes in the circuit of FIG. 1.

The Waveforms of FIG. 2 —the Charging Cycle

The left side of FIG. 2 shows the voltages during the capacitor charging phase and the right side shows the voltage during the capacitor discharging phase. The charging phase is started when associated components of the memory accessing circuit drop Vin. The down level of Vin turns on T4. The on state of T4 pulls down node N1 and thereby turns on T1 and T3. The on state of T1 holds output Vh at Vcc. Node N2 is charged to an up level through the series path of T1 and T3, and the up level of N2 turns T6 off and T7 on and thereby pulls node N3 down.

The Discharging Cycle

When Vin is raised to start a discharging phase of the cycle, T4 turns off and T5 turns on. The on state of T5 pulls node N2 down and thereby turns on T2 in the latch. T2 conducts to charge node N1 from ground to about Vcc and thereby turns off T1 and T3. (Note in FIG. 2 that node N1 is charged first to about Vcc and then later to about twice Vcc.)

The down level of node N2 turns T6 on and T7 off in the inverter stage, and T6 connects capacitor terminal N3 to Vcc. Capacitor Cb is connected to Vcc in a polarity for its voltage to add to Vcc and raise Vh to approximately twice Vcc.

The source terminals of T2 and T3 receive the output voltage Vh. The gate of T2 is at a down level, and T2 conducts between Vh and node N1 and thereby raises N1 to about twice Vcc. This voltage at node N1 is sufficient to turn off T1, even though node N1 is otherwise negative with respect to Vcc and would tend to turn on T1. The voltage at node N1 also keeps T3 turned off and thereby prevents a series connection of T3 and T5 from forming a path from Vh to ground. Thus, all of the FETs that are connected to the output node are turned off after the switching transition (except for T6, which carries the load current).

Other Embodiments

Those skilled in the art will recognize variations to adapt the circuit to various circuit technologies within the spirit of the invention and the intended scope of the claims.

I claim:

1. A circuit for driving a load with about twice the voltage of an associated power supply in response to a binary signal (Vin) on an input line, the power supply having a ground terminal and another terminal (Vcc), wherein the improvement comprises a capacitor (Cb) having a first terminal (N3) and a second terminal (Vh), the capacitor second terminal being connected directly to the circuit output, a CMOS inverter stage (T6, T7) having its output connected to the capacitor first terminal (N3), whereby the capacitor first terminal is connected to ground when the inverter stage output I2 has a down level and is connected to the power supply other terminal when the inverter stage output has an up level, a first FET (T1) for connecting the capacitor second terminal (Vh) to the power supply other terminal, a binary latch (T2, T3) having a first output node (N1) connected to control the first FET and a second output node (N2) connected to control the inverter stage for charging the capacitor when the latch is in a first state and for connecting the capacitor between the power supply other terminal and the load when the latch is in a second state, and means (T4, T5) connected to the first and second nodes of the latch and responsive to the input signal to switch the latch for charging and discharging the capacitor according to the timing of the input signal.

2. The circuit of claim 1 wherein the latch comprises a second FET (T2) and a third FET (T3) having their gate and drain terminals cross connected at the first and second latch output nodes.

3. The circuit of claim 2 including means (T1) connecting the source terminals of the second and third FETs to the power supply other terminal.

4. The circuit of claim 3 wherein the source terminals of the second and third FETs are connected to the output node (Vh) and the means connecting the source terminals to the power supply other terminal comprises the first FET, whereby the second FET (T2) charges the latch first node (N1) to a voltage to turn off said first FET during a capacitor discharging phase.

5. The circuit of claim 4 wherein the means responsive to the input signal comprises a fourth FET (T4) having its drain terminal connected to the first latch node (N1) and a fifth FET (T5) having its drain terminal connected to the second latch node (N2).

6. The circuit of claim 5 wherein the latch nodes are connected only to the gates of said second and third FETs and to the drains of said second, third, fourth and fifth FETs, whereby said second, third, fourth and fifth FETs stop conducting after the capacitances of the latch nodes have been charged or discharged following a transition in the input signal.

7. The circuit of claim 6 wherein
the fifth FET has its source terminal connected to ground and its gate terminal connected to the input signal line and wherein the fourth FET has its gate connected to a reference potential point and its source connected to the input line,
whereby the fourth and fifth FETs conduct oppositely in response to the input signal.

8. The circuit of claim 7 wherein
the inverter stage comprises a sixth FET (T6) connected to conduct between the power supply other terminal and the inverter stage output and a seventh FET (T7) connected to conduct between the inverter stage output and ground, and
the first and sixth FETs have the same channel conductivity type.

9. The circuit of claim 8 wherein the first, second and third FETs are p-channel FETs and the fourth and fifth FETs are n-channel FETs.

10. The circuit of claim 1 wherein the load is a word line in a semiconductor memory.

* * * * *